United States Patent
Nikovski et al.

(10) Patent No.: US 9,945,889 B2
(45) Date of Patent: Apr. 17, 2018

(54) METHOD FOR DETECTING POWER THEFT IN A POWER DISTRIBUTION SYSTEM

(71) Applicant: Mitsubishi Electric Research Laboratories, Inc., Cambridge, MA (US)

(72) Inventors: Daniel Nikolaev Nikovski, Brookline, MA (US); Zhenhua Wang, Clemson, SC (US)

(73) Assignee: MITSUBISHI ELECTRIC RESEARCH LABORATORIES, INC., Cambridge, MA (US)

( * ) Notice: Subject to any disclaimer, the term of this patent is extended or adjusted under 35 U.S.C. 154(b) by 1075 days.

(21) Appl. No.: 13/770,460

(22) Filed: Feb. 19, 2013

(65) Prior Publication Data

US 2014/0236506 A1    Aug. 21, 2014

(51) Int. Cl.
*G01R 21/00* (2006.01)
*G01R 22/06* (2006.01)
*G06F 11/30* (2006.01)
*G01R 19/25* (2006.01)

(52) U.S. Cl.
CPC ......... *G01R 21/006* (2013.01); *G01R 22/066* (2013.01); *G01R 19/2513* (2013.01)

(58) Field of Classification Search
CPC ...... G06Q 50/06; G06Q 10/04; G06Q 10/063; G01R 21/00; G01R 22/066; G01R 25/00; G01R 19/2513; G01R 21/006; H02J 3/00
USPC ......................................................... 702/61
See application file for complete search history.

(56) References Cited

U.S. PATENT DOCUMENTS

| | | | |
|---|---|---|---|
| 4,532,471 A | 7/1985 | Hurley | |
| 5,184,119 A | 2/1993 | Stanbury | |
| 7,936,163 B2 | 5/2011 | Lee, Jr. | |
| 2010/0007336 A1 | 1/2010 | de Buda | |
| 2011/0109472 A1* | 5/2011 | Spirakis | G06Q 10/06 340/870.02 |

(Continued)

OTHER PUBLICATIONS

"Calcul des pertes du distributeur," Jan. 1, 2007, p. 1-16. XP055116854. URL http:www.rseipc.fr/odf/grd/modele%20pertes%20rseipc.pdf. as in the IDS.*

(Continued)

*Primary Examiner* — Phuong Huynh
(74) *Attorney, Agent, or Firm* — Gene Vinokur; James McAleenan; Hironori Tsukamoto

(57) ABSTRACT

A method detects power theft in a branch of a distribution system by distinguishing between technical losses that are inevitable during the course of normal operation of the system, and non-technical losses that can be attributed to power theft. The method assumes a specific circuit corresponding to that branch, collects data for energy consumed and currents at regular intervals by means of a smart or traditional power meter, estimates the likely resistances of the lines connecting the consumption points to the distribution transformed by means of least squares regression, and uses the estimated resistances to predict technical losses in future time intervals. By comparing the total power losses measured during future intervals with the estimates of the technical losses, the amount of non-technical losses can be estimated, and theft can be signaled when this amount is unusually high.

9 Claims, 4 Drawing Sheets

(56) References Cited

U.S. PATENT DOCUMENTS

2012/0062210 A1    3/2012  Veillette
2013/0096987 A1*   4/2013  Omitaomu ......... G06Q 30/0205
                                                       705/7.34
2013/0151177 A1*   6/2013  Hughes .................... G06F 1/28
                                                       702/60

OTHER PUBLICATIONS

"Calcul des pertes du distributeur," Jan. 1, 2007, p. 1-16. XP055116854. URL http:www.rseipc.fr/odf/grd/modele%20pertes%20rseipc.pdf.

* cited by examiner

METHOD FOR DETECTING POWER THEFT IN A POWER DISTRIBUTION SYSTEM

FIELD OF THE INVENTION

This invention generally relates to power distribution systems, and more particular to detecting power theft.

BACKGROUND OF THE INVENTION

Power theft (non-technical losses (NTL)) is a significant problem for power distribution systems. The amount of theft can be as much as half of all energy supplied in some localities. The most common type of power theft occurs when consumers draw power directly from power lines between a distribution transformer (DT) and a power meter, so the illegally consumed power cannot be measured, and billed.

In general, the mismatch between the total energy supplied by the DT and the sum of energy consumed by all metered consumers can be detected, and the total amount of losses, technical and non-technical, in the distribution system can be estimated.

However, this amount includes both technical losses that are inevitable during the normal operation of the power distribution system, and the NTL. Technical losses comprise the Ohmic losses in the power lines due to the resistance of the lines, conversion losses in intermediate devices, leaks due to imperfect isolation, etc. Because some of the components of the technical losses depend on the amount of energy delivered to the consumers, and that amount varies significantly over time, it is generally difficult to determine what part of the total power loss is technical, and what part might be due to NTL.

It would be possible to determine accurately the exact amount of technical losses if all the parameters of the power distribution system are known, including its connection topology, order and attachment points of all consumers, the line resistances between the attachment points, as well as the instantaneous power consumption by every consumer at any moment in time.

In practice, full knowledge of these parameters is economically and technically infeasible. A power utility normally knows which consumer is served by which DT from the connecting topology, but the connection order and exact line resistances would not normally be known. In addition, full knowledge of the power consumption by any consumer at any instant in time would only be possible by installing detailed measurement equipment that performs very frequent measurements (multiple times per second). Such an installation would be prohibitively expensive with costs far exceeding the cost of power theft.

In practice, utilities measure power consumption only infrequently, e.g., every month for conventional meters and every 30 minutes for smart meters. The most important measurement available to power utilities is the total amount of active power consumed by a consumer during the measurement interval, because this value is the basis on which payment by the customer is determined.

Additional variables provided by some meters, for example smart meters conforming to the ANSI C12.19 standard, comprise reactive power consumed by the consumer (important for billing of some industrial customers), instantaneous voltage and current at the beginning and end of the measurement interval, power quality information, and the like.

A number of prior art methods for power theft detection are known, based on the limited set of measurements. One method estimates total power losses by balancing energy supplied by the DT, and the power consumed by all metered consumers, and determine the loss rate as a percentage of the total amount of energy provided. When this loss rate exceeds a specified threshold, e.g. 3%, then theft can be suspected and investigated.

A disadvantage of that method is that no distinction is made between technical and non-technical losses, so when technical losses are unusually high for good reasons, for example very uneven power consumption, the power theft could be detected erroneously.

SUMMARY OF THE INVENTION

The embodiments of the invention provide a method for accurately estimating technical losses from a limited set of measurements commonly available to power utilities during normal operations. The measurements can then be used to estimate accurately the amount of non-technical losses (NTL) in a power distribution system.

It is an object of the invention to construct a predictive model for the technical losses in a specific branch of the power distribution system entirely from measurement data, and use this model continuously to estimate technical losses at any measurement interval, so as to correctly apportion total power losses between technical losses and NTL (theft). In the model all consumers connect to a distribution transformer (DT) by individual and independent power lines. The model is used to determine a mathematical expression for the total power losses, enables the use of least-squares estimation of resistances. Thus, the model represents an approximation to the real physical distribution system that corresponds to the mathematical expressions, capturing its main characteristics that determine the degree of technical losses.

To construct the model, the method collects measurement data, represents a branch of the distribution system by an idealized circuit that approximates the actual distribution circuit, and estimates the parameters of the idealized circuit by means of a statistical estimation method. The model is then continuously applied on newly collected measurement data to estimate technical losses and NTL.

Our method for detecting power theft is based on the predictive model for technical losses in a power distribution system equipped with smart meters. The predictive model is constructed entirely from measurements acquired from the smart meters. Because there are several significant sources of error and noise in the measurement process, such as infrequent measurements and unknown topology of the distribution circuit, our method relies on a statistical estimation procedure to fit a good model to the measurements.

DETAILED DESCRIPTION OF THE PREFERRED EMBODIMENTS

Figure 1:
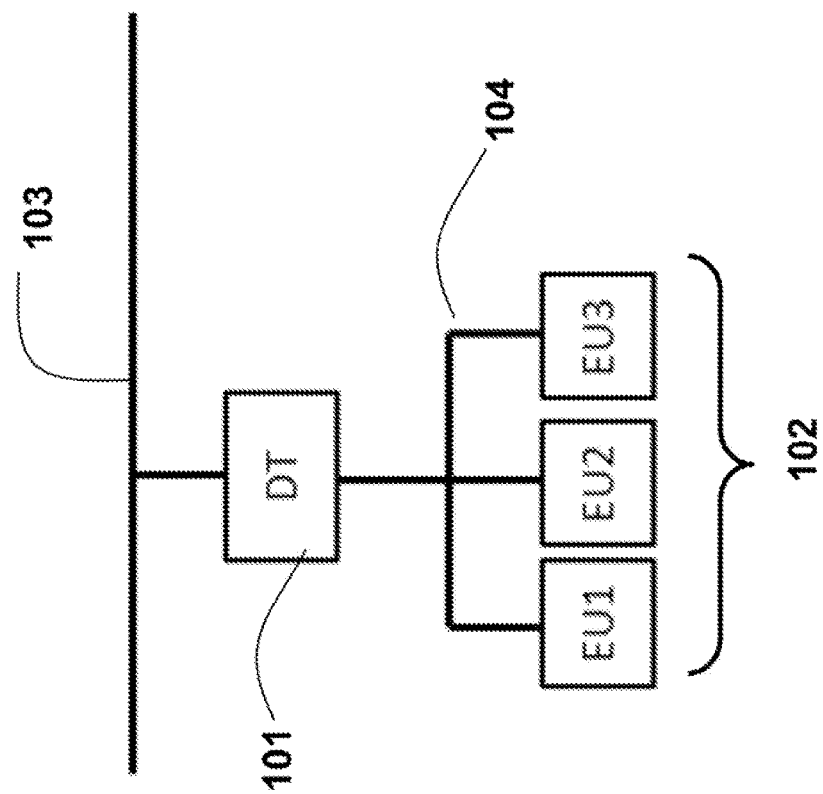
FIG. 1 is a simplified schematic of a branch of a power distribution system in which the embodiments of the invention operate.

As shown in FIG. 1, the embodiments of our invention detect non-technical losses (NTL) in a branch of a power distribution system including a distribution transformer (DT) 101 connected to a sub-station by means of a feeder 103, and a number of consumers (end users (EU1, EU2, EU3)) 102 by a set of lines 104.

In general, the connection pattern is not known. The most typical pattern connects the DT to the consumers at various locations along the feeder. The exact locations are unknown, and the resistances of the line between these locations are also unknown.

Figure 2:
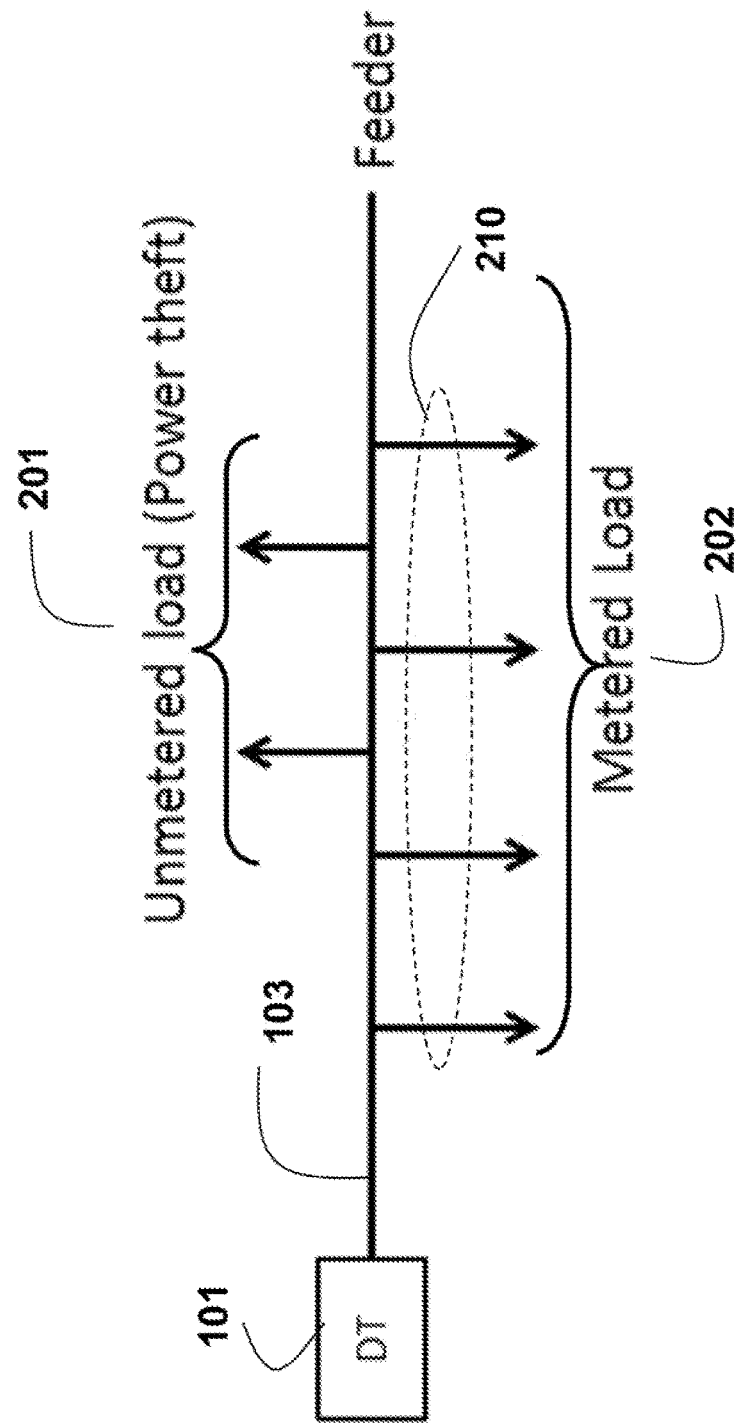
FIG. 2 is a schematic of a circuit of a branch of a power distribution system in which the embodiments of the invention operate to detect unmetered loads.

FIG. 2 shows a branch with unmetered loads 201, and metered loads 202 connected via a subset 210 of the lines.

Figure 3:
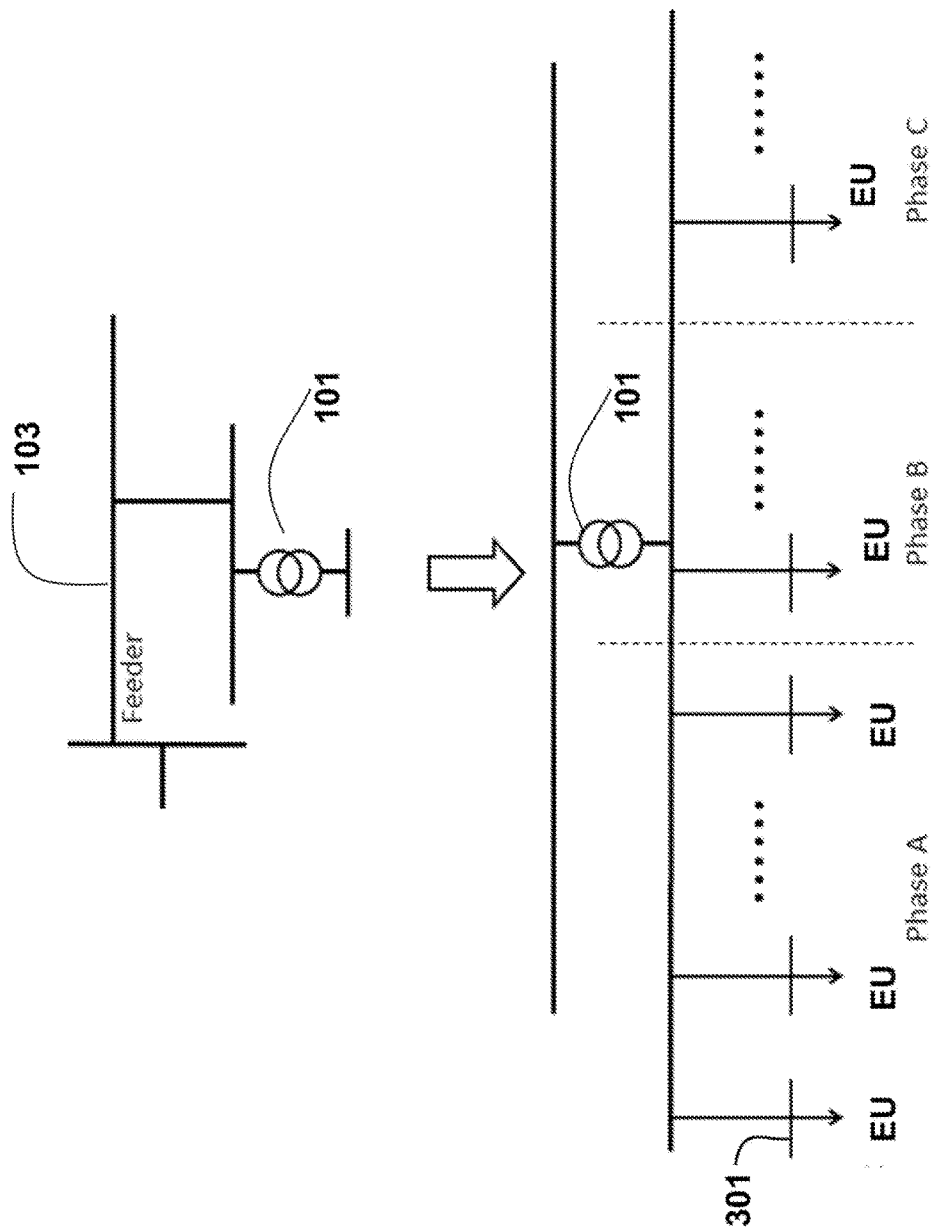
FIG. 3 is a schematic of an approximating circuit of a power distribution system in which the embodiments of the invention operate.

In the absence of detailed information about the actual circuit of the branch, we make a simplifying assumption that it has a specific topology and connectivity pattern shown in FIG. 3. In FIG. 3, each consumer (EU) is connected indirectly to the DT through a smart meter 301. The phases A, B, and C are the three phases of a three-phase power system. Unlike industrial customers that use all three phases, household consumers typically only connect small loads to a single phase. This is the case shown here. For some larger appliances (electric ovens, water heaters, air conditioners, etc.), two of the phases can be used, and this complicates the analysis. However, in that case, the large load can be divided between the two phases, and the analysis can be done phase by phase, as described herein.

We assume that each consumer is connected to the secondary side of the transformer by means of a single line. When the consumer is connected to multiple phases of the distribution system, we treat each phase as a separate and independent consumer. Because energy balance and loss modeling is performing independently for each phase in a multi-phase system, below we describe the model for a single phase only.

We define the following variables for the simplified circuit:

$R_i$ The actual resistance of the line to consumer i;
$\hat{R}_i$ The estimated resistance of the line to consumer i;
$1_{i,k}=I_i(t_k)$ The measured instantaneous current of branch i at the end of time interval k
$L_{i,k}$ Technical loss of branch i during time interval k;
$L_k$ Total loss during time interval k the branch based on a power balance between the DT and all metered consumers;
$l_0$ Non-Ohmic technical loss (time independent); and
$\hat{O}_k$ The estimated NTL during time interval k.

For smart meters, the time interval is typically 30 minutes, and for conventional meters, it could be one month or longer.

The Ohmic losses due to the resistance of the transmission line to consumer i are $$L_{i,k} = \int_{t_{k-1}}^{t_k} I_i(t)^2 R_i dt. \quad (1)$$

In practice, as noted above, we do not know the resistance $R_i$ of branch i, nor the instantaneous current $I_i(t)$ at all instants between times $t_{k-1}$ and $t_k$. For this reason, we make an additional simplifying assumption that the relation between current magnitude and time is piecewise linear:

$$\hat{I}_i(t) = s_{i,k} t + I_i(t_{k-1}), \quad (2)$$

where:

$$t: \text{time}, t_{k-1} < t < t_k, \text{ and} \quad (3)$$
$$s_{i,k}: \text{slope}, s_{i,k} = \frac{I_i(t_k) - I_i(t_{k-1})}{t_k - t_{k-1}}.$$

That is we measure the currents at time instances, e.g., 30 minutes apart. However we do not know the resistances on the lines. Therefore, we estimate the resistances from historical data. When we want to predict technical losses at future times, we use the estimated resistances, together with the measured currents. It is also important to note that we do not have an entire current profiles during a measurement interval, but only the instantaneous currents at each two ends of the interval. Thus, we must make some assumption about the current profile within that interval. Our assumption is that the current profile is piece-wise linear, i.e., linear interpolation between the measurements at the end points. However, other assumptions, for example cubic splines, also are possible.

For conventional meters, the measurements span multiple days, and the currents during the interval are assumed to be constant and equal to an average current corresponding to energy consumed within the interval and a nominal voltage of the power distribution system.

We rewrite equation (1) as $$\hat{L}_{i,k} = \frac{1}{s_{i,k}} \int_{I_i(t_{k-1})}^{I_i(t_k)} \hat{I}_i(t)^2 R_i \, dI_i(t) = \frac{R_i}{3 s_{i,k}} [I_i(t_k)^3 - I_i(t_{k-1})^3]. \quad (4)$$

Then, the total loss is:

$$\hat{L}_k = \sum_{i=1}^{n} \frac{I_i(t_k)^3 - I_i(t_{k-1})^3}{3 s_{i,k}} R_i + l_0, \quad (5)$$

where n is the number of smart meters.

Then, the estimates of the branch resistances $\hat{R}_i$ can be obtained by means of a least squares (LS) method, for example using the Moore-Penrose pseudoinverse:

$$\hat{R} = (\overline{H}^T H)^{-1} \overline{H}^T L, \text{ where} \quad (6)$$

$$H = \begin{bmatrix} \frac{I_1(t_2)^3 - I_1(t_1)^3}{3s_{1,2}} & \frac{I_2(t_2)^3 - I_2(t_1)^3}{3s_{2,2}} & \cdots & \frac{I_n(t_2)^3 - I_n(t_1)^3}{3s_{9,2}} & 1 \\ \frac{I_1(t_3)^3 - I_1(t_2)^3}{3s_{1,3}} & \frac{I_2(t_3)^3 - I_2(t_2)^3}{3s_{2,3}} & \cdots & \frac{I_n(t_3)^3 - I_n(t_2)^3}{3s_{9,3}} & 1 \\ \cdots & \cdots & \cdots & \cdots & 1 \\ \frac{I_1(t_m)^3 - I_1(t_{m-1})^3}{3s_{1,m}} & \frac{I_2(t_m)^3 - I_2(t_{m-1})^3}{3s_{2,m}} & \cdots & \frac{I_n(t_m)^3 - I_n(t_{m-1})^3}{3s_{n,m}} & 1 \end{bmatrix},$$

$$L = \begin{bmatrix} L_2 \\ L_3 \\ \vdots \\ L_m \end{bmatrix}, \hat{R} = \begin{bmatrix} \hat{R}_1 \\ \hat{R}_2 \\ \cdots \\ \hat{R}_n \\ l_0 \end{bmatrix},$$

and m represents the number of measurement intervals. The non-Ohmic losses $I_0$ that are not caused by, and are proportional to, line resistances. These losses might or might not be due to theft.

To determine the LS estimate of the resistances, the system should be overconstrained. That is, the number of measurement intervals m is greater than the number of smart meters n. This requirement is usually easy to satisfy, by collecting a number of measurements that exceeds the number of metered users in the distribution branch.

After the parameter vector $\hat{R}$ has been obtained, we can use $\hat{R}$ to determine the non-technical losses $\hat{O}_k$ for any future interval k as $$\hat{O}_k = L_k - \sum_{i=1}^{n} \frac{I_i(t_k)^2 - I_i(t_{k-1})^2}{3s} \hat{R}_i - I_0.$$

Figure 4:
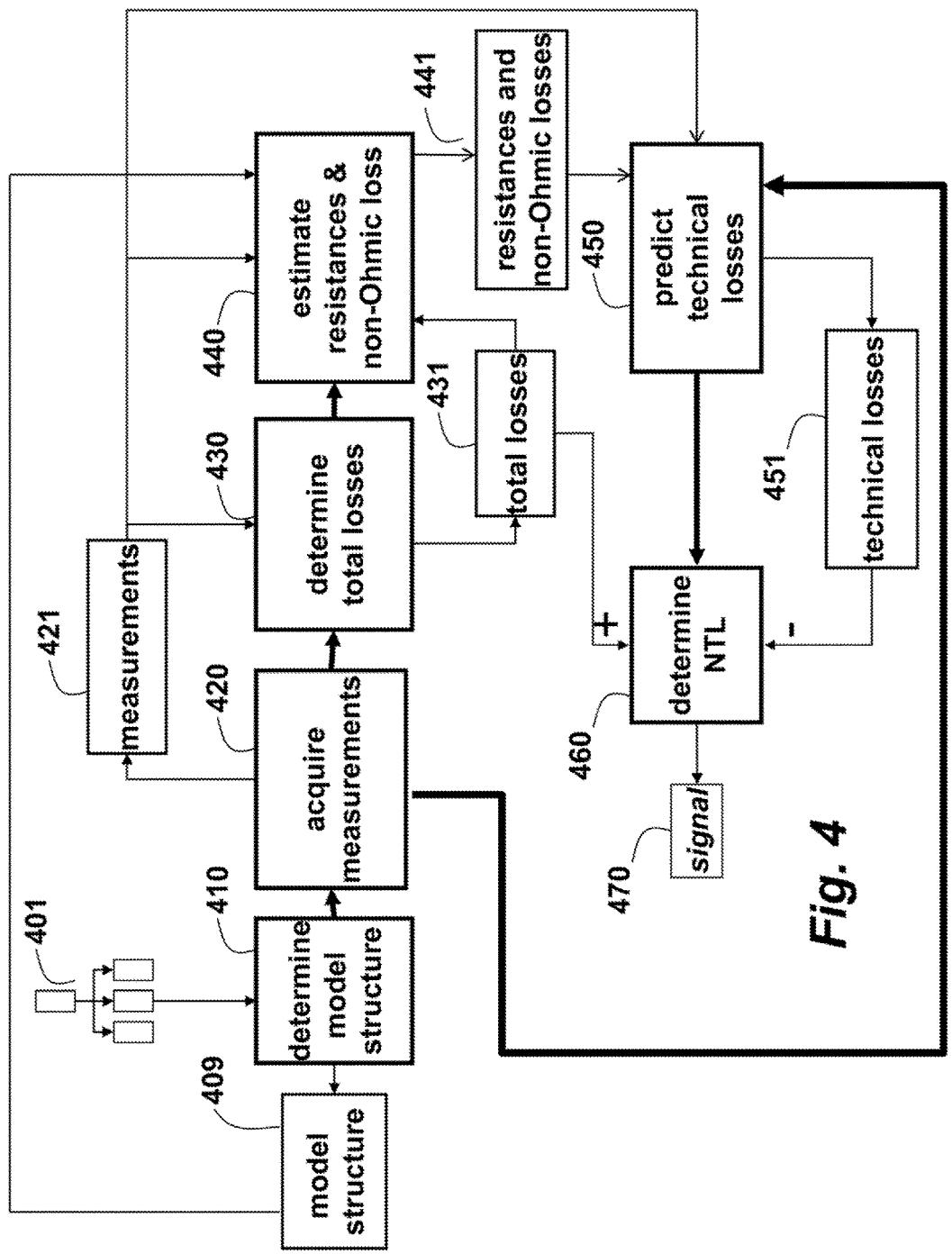
FIG. 4 is a flow diagram of a method for detecting power theft according to embodiments of the invention.

FIG. 4 shows our method for detecting power theft. 1. First, we construct 410 a model structure 409 representing a physical branch 401 of the power distribution system as a circuit. This can be a one-time off-line operation.

During the training phase, we acquire 420 measurements 421 of energy consumed in the branch and measurements of currents in the lines at an end of a current interval using the meters, and measurements of the current at the DT.

Using the measurements, we determine 430 the total power losses 431. Then, we estimate 440, based on the model, resistances and non-Ohmic losses 441 from the total power losses and the currents during an interval when only technical losses are present. These estimates 441 are stored in permanent memory.

At run-time, during continuous operation, the amount of technical losses 451 is determined 450 from the measurements 421 and previously estimated line resistances 441. This run-time process flow is shown by the directed arrow directly from step 420 to step 450. After that, the non-technical losses are determined 460 by subtracting the technical losses 451 during the future interval from the total power losses 431. If the technical losses are greater than a predetermined threshold, then a power theft can be signaled 470. The off-line and run-time steps can be performed in a processor connected to memory and input/output interfaces as known in the art.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for detecting non-technical losses in an actual branch of a power distribution system by an actual distribution circuit, wherein the actual distribution circuit includes a set of lines with unknown resistances that connect consumers to a distribution transformer (DT), and a subset of the lines include meters, comprising the steps:
    employing a processor executing computer executable instructions stored on a computer readable memory to facilitate performing the steps of:
    constructing a predictive model structure for estimating technical losses in a substitute branch the actual branch, the substitute branch includes an alternate circuit illustrative of the actual distribution circuit, wherein the alternate distribution circuit is configured for estimating parameters of the alternate circuit on the basis that each consumer in the alternate distribution circuit is individually and independently connected to the distribution transformer (DT) by means of a single dedicated line;
    acquiring historical measurements of energy consumed in the branch and historical measurements of currents in the lines at the endpoints of an historical interval via the meters, and historical measurements of the current at the DT;
    determining, based on the historical measurements, historical total power losses in the substitute branch;
    estimating, based on the predictive model structure, estimated resistances and estimated non-Ohmic losses from the historical total power losses and the historical currents during an historical interval when only historical technical losses are present;
    predicting technical losses during a future time interval using the estimated resistances and future currents; and
    determining future non-technical losses by subtracting the predicted technical losses during the future time interval from the total power losses during the future time interval, wherein the determined future non-technical losses are used to rank a list of potential power theft sites, and inspection is performed in decreasing order of an amount of power theft.

2. The method of claim 1, wherein the estimating uses least squares regression.

3. The method of claim 1, wherein the meters are smart meters, and the measurements are acquired several times each day, and instantaneous currents within the interval are determined by linear interpolation of the currents measured by the meter at the end of the interval.

4. The method of claim 1, wherein the meters are smart meters, and the measurements are acquired several times each day, and instantaneous currents within the interval are determined by cubic spline interpolation of the currents measured by the meter at the end of the interval.

5. The method of claim 1, wherein meters acquire the measurements at intervals spanning multiple days, and the currents during the interval are assumed to be constant and equal to an average current corresponding to energy consumed within the interval and a nominal voltage of the power distribution system.

6. The method of claim 1, further comprising:
    signaling the non-technical losses greater than a predetermined threshold as a power theft.

7. The method of claim 1, wherein the predicting is performed continuously.

8. The method of claim 1, wherein the acquiring the measurements, the predicting the technical losses and determining non-technical losses are performed at run-time.

9. A system for detecting non-technical losses in an actual branch of a power distribution system by an actual distribution circuit, the system comprising:
    a distribution transformer (DT) connected to a sub-station via a feeder, wherein a set of lines of the actual distribution circuit have unknown resistances that connect consumers to the DT, and a subset of the lines include meters;
    a data storage memory having stored therein information about historical measurements of energy consumed in the branch and historical measurements of currents in the lines at the endpoints of an historical interval via the meters, and historical measurements of the current at the DT;

a processor, coupled to the data storage memory, that is configured to:

construct a predictive model structure for estimating technical losses in a substitute branch representing the actual branch, the substitute branch includes an alternate circuit illustrative of the actual distribution circuit, wherein the alternate distribution circuit is configured for estimating parameters of the alternate circuit on the basis that each consumer in the alternate distribution circuit is individually and independently connected to the distribution transformer (DT) by means of a single dedicated line;

acquire historical measurements of energy consumed in the branch and historical measurements of currents in the lines at the endpoints of an historical interval via the meters, and historical measurements of the current at the DT, stored in the data storage memory;

determine, based on the historical measurements, historical total power losses in the substitute branch;

estimate, based on the predictive model structure, estimated resistances and estimated non-Ohmic losses from the historical total power losses and the historical currents during an historical interval when only historical technical losses are present;

predict technical losses during a future time interval using the estimated resistances and future currents; and determine future non-technical losses by subtracting the predicted technical losses during the future time interval from the total power losses during the future time interval, wherein the determined future non-technical losses are used to rank a list of potential power theft sites, and inspection is performed in decreasing order of an amount of power theft.

* * * * *